(12) United States Patent
Bladh

(10) Patent No.: US 7,443,232 B2
(45) Date of Patent: Oct. 28, 2008

(54) ACTIVE LOAD ARRANGEMENT

(75) Inventor: Mats Bladh, Tullinge (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 546 days.

(21) Appl. No.: 10/517,464

(22) PCT Filed: Jun. 6, 2002

(86) PCT No.: PCT/SE02/01092

§ 371 (c)(1), (2), (4) Date: Jul. 14, 2005

(87) PCT Pub. No.: WO03/105341

PCT Pub. Date: Dec. 18, 2003

(65) Prior Publication Data

US 2007/0063746 A1    Mar. 22, 2007

(51) Int. Cl.
*H03H 11/48* (2006.01)
*G01R 31/02* (2006.01)

(52) U.S. Cl. ...................................... 327/581; 324/520

(58) Field of Classification Search ................. 324/520; 327/581

See application file for complete search history.

(56) References Cited

U.S. PATENT DOCUMENTS

| | | | |
|---|---|---|---|
| 5,047,728 A | 9/1991 | Bayrums |
| 5,047,729 A | 9/1991 | Bayrums |
| 5,072,199 A | 12/1991 | Furlow |
| 5,151,669 A | 9/1992 | Roques et al. |
| 5,361,038 A | 11/1994 | Allen et al. |
| 5,394,025 A | 2/1995 | Pierson |

FOREIGN PATENT DOCUMENTS

| | | |
|---|---|---|
| EP | 0528413 | 2/1993 |
| EP | 0528413 A2 | 2/1993 |
| WO | WO 9705695 | 2/1997 |
| WO | WO 9705695 A1 | 2/1997 |

*Primary Examiner*—Evan Pert

(57) ABSTRACT

An active load arrangement is used to provide proper output load to an object TO under test. The arrangement Z comprises a voltage_controlled transistor MOSFET having a source S, a gate G and a drain D. The drain D is associated with the gate G and connected to an arrangement input I2 associated with an output O1 of the object under test. The source S is connected to an arrangement output O2 associated with an input I1 of the object under test. A feedback arrangement is connected to the source S and the gate G. The feedback arrangement changes phase and amplitude of the gate-to-source voltage by varying frequency in order to obtain low impedance at low frequencies and high impedance at high frequencies.

8 Claims, 4 Drawing Sheets

ACTIVE LOAD ARRANGEMENT

TECHNICAL FIELD OF THE INVENTION

The present invention relates to an active load arrangement providing proper output load to a device under test.

DESCRIPTION OF RELATED ART

Automatic test equipment is frequently employed to run diagnostic tests on integrated circuit devices. A purpose of a testing device is to ensure that integrated circuits under test provide the proper output voltages given the input stimulus of the tester. It is necessary that such devices simulate the proper output load. In the U.S. Pat. No. 4,712,058 is disclosed an active load network for a device under test and for turning on either a current source or a current sink to properly load its output. The current sink and current source each comprises a pair of CMOS transistors connected in series. An active load network that provides low resistance for direct current DC and high impedance for alternating current AC is often necessary when testing an object of for example line interface type. This type of load network prevents superposed AC parameters to be essentially influenced by DC load. When measuring AC parameters of a test object, the AC impedance of the load network must be essentially higher than the AC impedance of the test object. High AC impedance and low DC resistance can be accomplished by an inductance. However, when measuring on low frequency signals from about 200 Hz and high impedance load above 150 kohm is required, the inductance has to be more than 120 H. This type of AC impedance is necessary when measuring for example on line interface circuits within POTS (Plain Old Telephone Service) telephony. A passive inductance i.e. a coil of that inductance size which can stand enough current without being saturated will be bulky and expensive. The necessary size of such a coil may cause other types of problems like magnetic energy storing causing high voltages at circuit breaking or other rapidly changing loads. Also magnetic and electrical EMC problems depending on internal and external crosstalk may occur. Another possible solution would be to design an active inductance. Active inductances have been made with bipolar transistors. Since bipolar transistors are current controlled devices, several are needed in some kind of high current gain configuration like Darlington connection to get the necessary high impedance to the control input of the circuit. Solutions like the one above is however complicated.

SUMMARY OF THE INVENTION

The present invention relates to a problem how to provide proper output load to a device under test requiring low resistance for DC voltages and high impedance for AC voltages.

A purpose with the invention is to facilitate measurements of a test object without essentially influencing superposed AC voltage parameters from the device under test.

The problem is solved by the invention by an active load arrangement comprising a voltage-controlled transistor associated with a feedback arrangement. The feedback arrangement controls the DC bias point, and by superimposed AC input the arrangement controls the phase and the amplitude for the control signals to the transistor inputs.

More in detail, the active load arrangement comprises a voltage-controlled transistor called Metal Oxide Semiconductor Field Effect Transistor, MOSFET, having a source, a gate and a drain. The drain is connected to an input of the arrangement associated with an output of the object under test. A resistor is connected between the gate and the drain. An inductance is connected between the source and an output of the arrangement associated with an input of the object under test. A capacitance is connected between the gate and the arrangement output.

One advantage with the invention is that the impedance for the active load arrangement not is limited to the internal drain-source resistance but can be further enhanced by the feedback nets.

Another advantage with the invention is that high impedance is obtained without the need of bulky passive components.

Yet another advantage is that the MOSFET is a cheap component and only one active device with a few additional components are needed for the invention.

The invention will now be described more in detail with the aid of preferred embodiments in connection with the enclosed drawings.

DETAILED DESCRIPTION OF EMBODIMENTS

Figure 1:
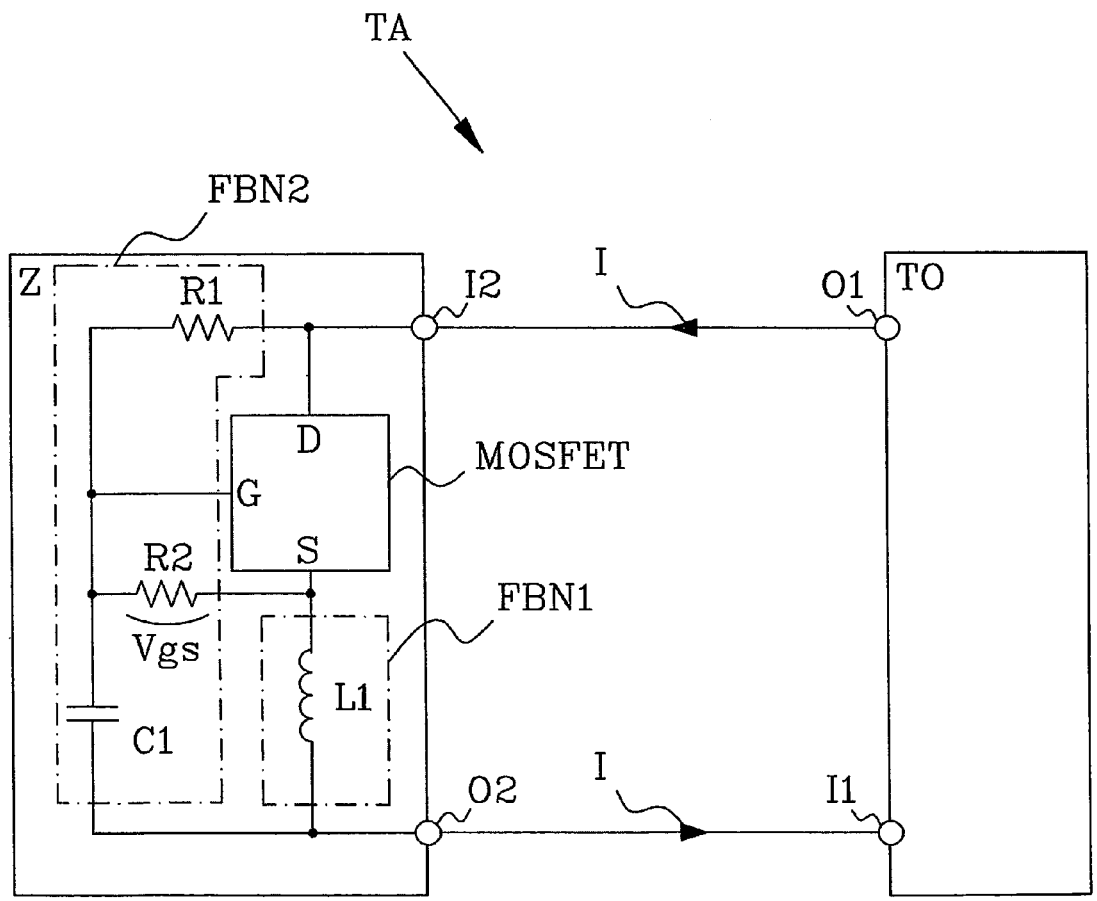
FIG. 1 shows a schematic diagram of an active load arrangement connected to a test object.

In FIG. 1 is disclosed a test arrangement TA comprising an active load arrangement Z connected to a test object TO. The active load arrangement provides proper output load to the object under test. The test object, which for example can be a POTS line interface circuit in a telecommunication system, comprises an object output O1 and an object input I1. The load arrangement Z comprises an arrangement input I2 associated with the object output O1. The arrangement Z also comprises an arrangement output O2 associated with the object input I1. The load arrangement Z further comprises a MOSFET with a drain D, a gate G and a source S. The semiconductor in this example is of the type IRF610. The drain D is connected to the arrangement input I2. A first resistance R1, in the example 2,2E6 ohm, is connected between the drain D and the gate G. A second resistance R2, in the example 2,2E6 ohm, is connected between the gate G and the source S. A capacitor C1, in the example 6,8 µF, is connected between the gate and the arrangement output O2. An inductance L1, in the example 42 mH, is connected between the source and the arrangement output O2. The inductance L1 is called a first feedback net FBN1 and the resistances R1 and R2 together with the capacitor C1 is called a second feedback net FBN2.

The test object TO in this example is a POTS line interface circuit and it works under normal OFF HOOK operation with an AC voltage superposed on a DC voltage. In order to activate and measure the AC parameters of the test object, a load arrangement called DC-loop is necessary to supply low-resistance DC load and high-impedance AC load. The low-resistance DC load make the line interface circuit to go into the state where it is working with 2 wire AC voice signals. The high-impedance AC-load is needed because the superposed AC parameters must be as uninfluenced as possible by the DC load. The load arrangement must be essentially higher than the AC impedance of the test object TO.

Figure 2:
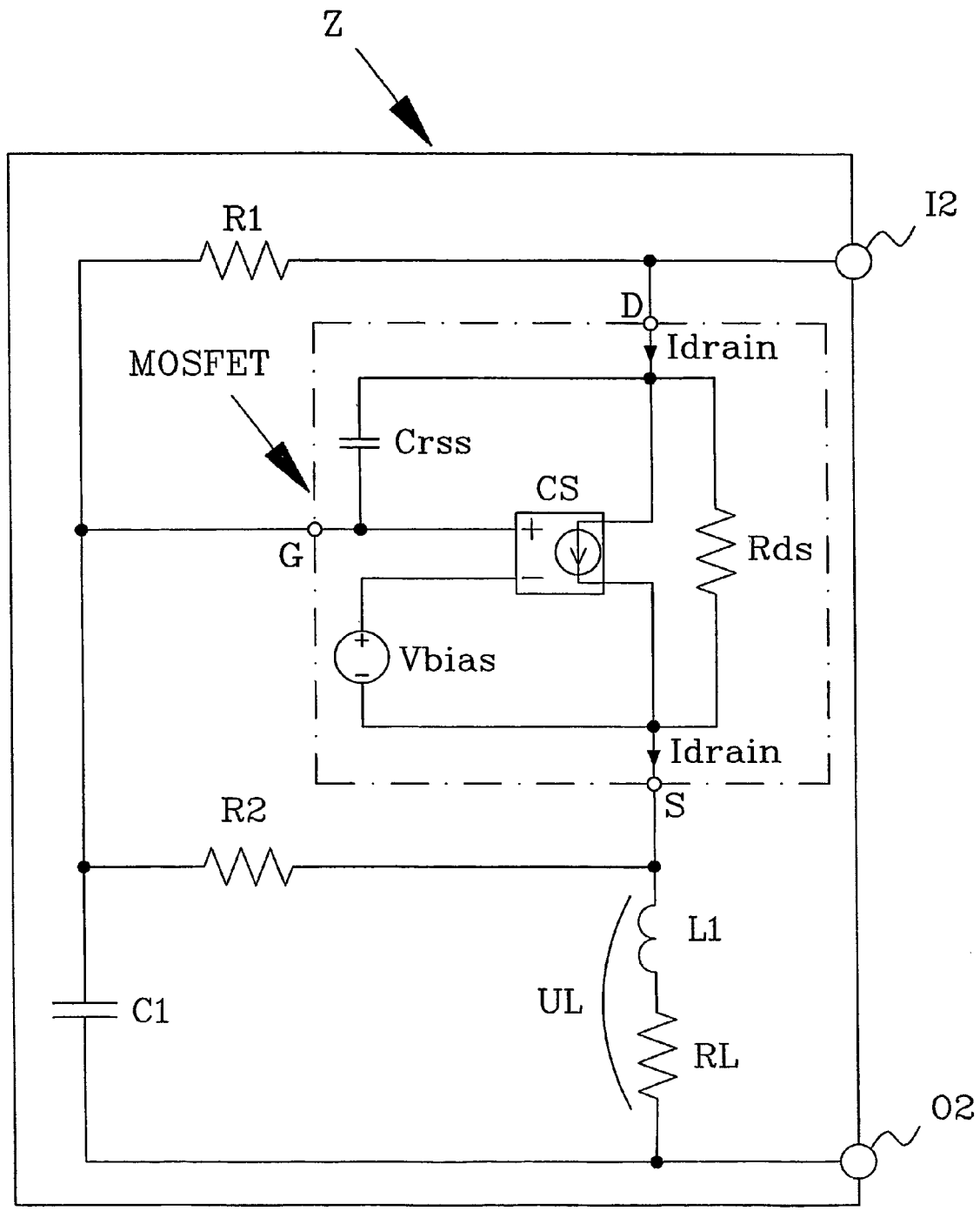
FIG. 2 shows an active load arrangement more in detail with the aid of an equivalent MOSFET diagram.

The invention will now be explained with the aid of FIG. 1 and FIG. 2. FIG. 2 discloses more in detail the active load arrangement Z shown in FIG. 1. FIG. 2 shows the earlier mentioned first resistance R1, the second resistance R2 and the capacitor C1. In FIG. 2, also the internal resistance RL of the inductance L1 is shown. The MOSFET shown in FIG. 1 is shown in FIG. 2 as an equivalent circuit diagram suitable for simulation of the invention, i.e. a simulation model. A voltage controlled Current Source CS is situated in the MOSFET model between the gate G, the drain D and the source S. A static drain-to-source resistance $R_{ds}$ is shown between drain and source. A reverse transfer capacitance $C_{rss}$ is shown between the gate and the drain. To be able to simulate the approximate DC bias point of the circuit a voltage bias $V_{bias}$ is placed between the source S and a minus pin of the voltage controlled current source CS.

A suitable working-point for the MOSFET is selected with respect to the DC needed for the test object TO, the reverse transfer capacitance $C_{rss}$ and the power dissipation of the MOSFET. High drain D to source S voltage results in high power dissipation and low Crss. Low drain current results in high $R_{ds}$, low forward transconductance Gfs and low power dissipation. The working point is selected by means of the first resistance R1 and the second resistance R2. R1 and R2 will bias the gate so that the drain voltage will be approximately 10V and so that the gate voltage will be approximately 5V when using a MOSFET type IRF610 which has a $V_{bias}$ of about 5V for the current values that are valid, i.e. 10-100 mA. This bias will create sufficient drain-source voltage for different currents to the test object. The capacitor C1 together with the resistance R1 and R2 will have the effect of a low-pass filter. Since the MOSFET is a voltage controlled device it has a very high input resistance. R1 and R2 can then be set to very high resistance values without being loaded by gate currents. This is necessary because R1 and R2 add AC load to the circuit. C1 can be set to a low capacitance value while the circuit still will reach the necessary filtering capability, because R1 and R2 are high resistive. This is also an advantage because the low capacitance value eliminates the need of an electrolytic capacitor.

The superposed AC delivered from the test object will due to the low-pass filter R1, R2 and C2 cause the AC voltage on the gate G to go towards the object output O2.

$R_{ds}$, CS and L1 creates a signal path to the source S. The superposed AC will then result in a voltage across L1 which gives a source to gate voltage when the voltage between the gate and the output O2 goes towards zero which will rise the $Z_{ds}$ above the $R_{ds}$ value.

The AC behavioral of the MOSFET, somewhat simplified without the affection of $C_{rss}$, the impedance $Z_{ds}$ between drain D and source S can be expressed in the following equation:

$$Z_{ds} = \frac{V_{ds}}{\frac{V_{ds}}{R_{ds}} + Gfs * V_{gs}}$$

$V_{ds}$ is the AC voltage between drain and source.

$R_{ds}$ is the linearized resistance between drain and source at a fixed DC current and voltage. IRF610 is typical 10 kohm at DC drain current 80 mA and DC drain to source voltage 10V.

$V_{gs}$ is the AC voltage between gate and source.

Gfs is the linearized forward transconductance at a fixed DC current and voltage. IRF610 is typical 0.31 A/V at DC drain current 80 mA and DC drain-source voltage 10V, for $V_{gs}=V_{ds}$ then $Z_{ds}=1/Gfs$. For IRF610 10V/80 mA, $Z_{ds}=3.2$ ohm.

When the $V_{gs}$ voltage goes towards zero it can be seen in the equation that drain-source impedance $Z_{ds}$ goes towards $R_{ds}$, for IRF610 10V/80 mA, Rds=10 kohm.

If then $V_{gs}$ is inverted and $V_{ds}/R_{ds}+Gfs*V_{gs}$ becomes zero, $Z_{ds}$ is equal to infinity.

In the invention the feedback nets are arranged so that at low frequencies $V_{gs}=V_{ds}*R1/(R1+R2)$ applies. The low frequency AC impedance will then be low. At high frequencies the $V_{gs}$ will change phase and amplitude in a way that the impedance rises and $V_{ds}/R_{ds}+Gfs*V_{gs}$ goes towards 0. When $V_{gs}$ gets negative the impedance will be even higher than $R_{ds}$.

According to the invention, when the AC gate voltage goes towards zero, the AC drain current $I_{drain}$ will decrease. Due to the $R_{ds}$ and Gfs, a voltage $U_L$ will arise over L1 and RL and an inverted gate-source voltage appears. As can be seen in the equation, the inverted gate-source voltage $V_{gs}$ leads to increased drain-source impedance $Z_{ds}$, above $R_{ds}$. This appears distinctly in FIG. 3 where a simulation using the exemplified arrangement is presented.

Figure 3:
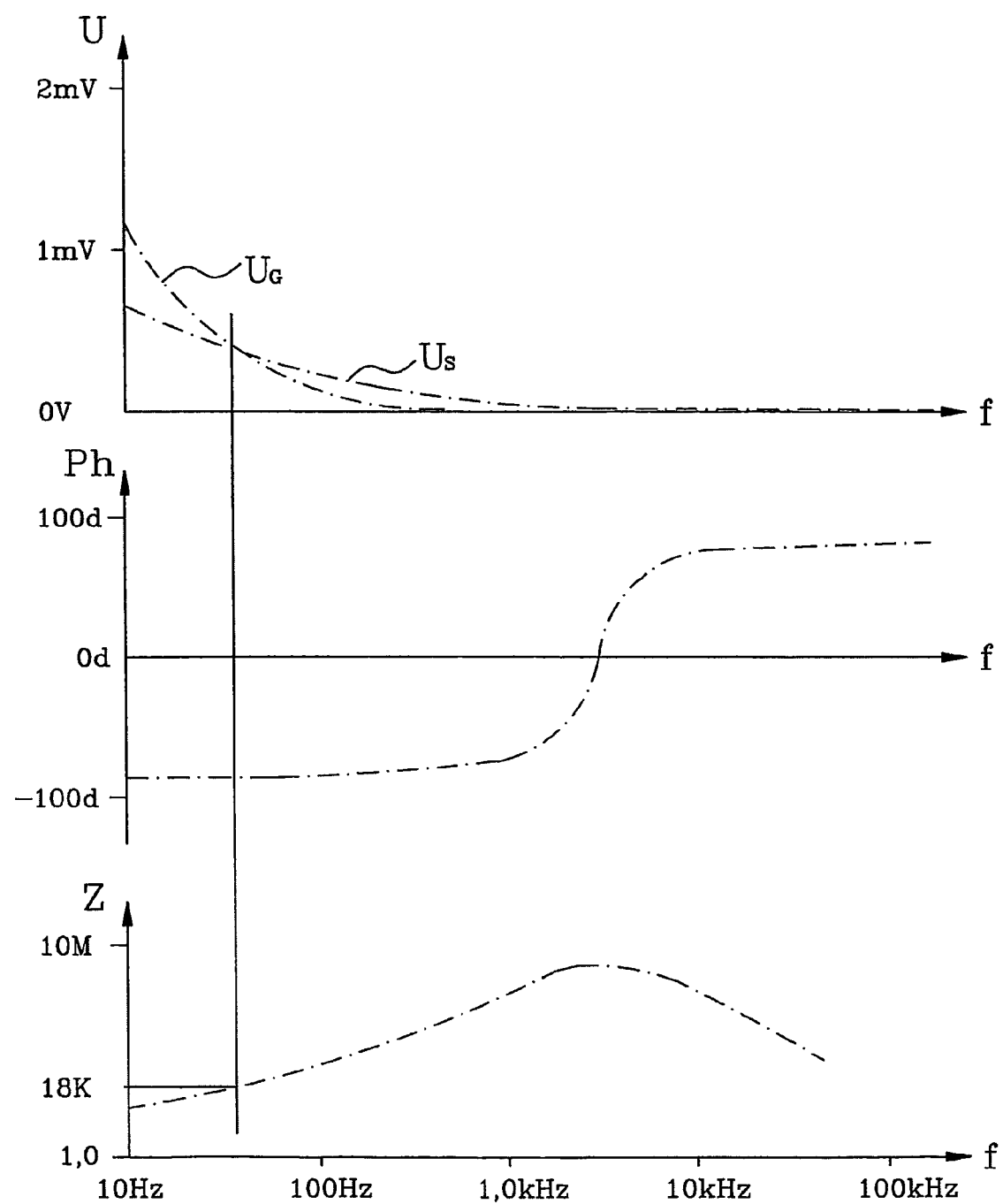
FIG. 3 shows results from a simulation using the active load arrangement.

In FIG. 3 is disclosed a simulation of the above described active load arrangement. It is to be observed that the simulation is disclosed schematic with a purpose to show the principle and enhance the understanding of the invention. In FIG. 3 can be seen three diagrams. A first diagram U shows a voltage $U_G$ between the gate G and the output O2, and a voltage $U_S$ between the source S and the output O2, as a function of the frequency f. In a second diagram $P_h$ the phase between the input I2 and the output O2 is shown as a function of the frequency f. A third diagram Z shows the I2 to O2 impedance as a function of the frequency f. In the first diagram U can be seen how the source voltage $U_S$ and the gate voltage $U_G$ decreases by increasing frequency f due to the two feedback nets FBN1 and FBN2. At a specific point $U_S=U_G$ applies. Because of phase differences of about fifty degrees between FBN1 and FBN2, $U_{SG}$ is almost equal to $U_S$ or $U_G$. At this point the I2 to O2 impedance Z is higher than $R_{ds}$. This can be seen in the third diagram where Z=18 kohm. At this point the drain to source impedance Z is equal to $R_{ds}$, as have been explained above. In the second diagram Ph the phase goes from approximately −100 degrees to +100 degrees by increasing frequency, i.e. from inductive to capacitive impedance. When the phase curve reach zero degrees, the impedance reaches it maximum at the parallel resonance of the active load arrangement. The Z in the third diagram is resistive at DC and gradually goes inductive from low frequencies up to a point where it creates a parallel resonance circuit together with $C_{rss}$. R1 is in parallel with the circuit and limits the maximum impedance that can be reached because at high frequencies the reactance of C1 is much lower than the resistance of R1 and R2.

When the invention is to be used for measurement purposes it may be made for bipolar operation. The invention can be placed in a rectifier bridge on the rectified output side. The rectifier bridge add 2 reversed biased diodes with 2 diode capacitances and the other 2 forward biased diodes add 2 diode voltage drops and diode resistances to the invention.

Figure 4:
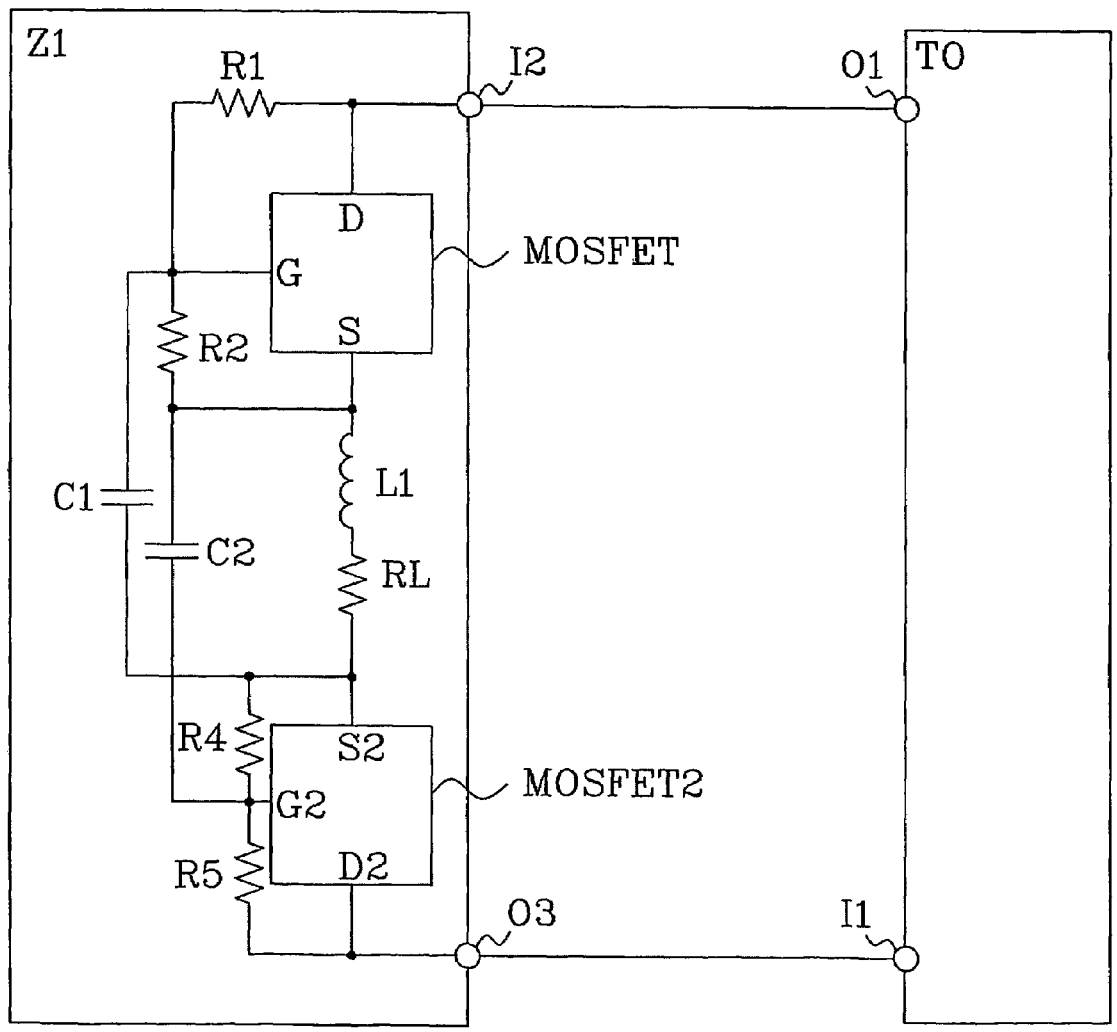
FIG. 4 shows a schematic diagram of two active load arrangements connected in reverse.

A second embodiment is disclosed in FIG. 4. The figure shows a solution where two active load arrangements like the one shown in the first embodiment are connected in reverse and thus bypassed by an internal drain-source diode of one of the MOSFETs. By connecting the two arrangements reversed together and by slightly modify the solution they will be able to share the same inductance L1. This modification is disclosed in FIG. 4. A load arrangement Z1 comprises a second semiconductor MOSFET2 comprising a second source S2, a second gate G2 and a second drain D2. The second source S2 is connected via a fourth resistance R4 to the second gate G2. The second gate G2 is connected via a fifth resistance R5 to the second drain D2 and to an arrangement output O3. The second drain S2 is connected via the capacitance C1 discussed in the first embodiment, to the gate G. The second gate G2 is connected via a second capacitor to the source S of the earlier discussed MOSFET. The second source S2 is connected to the earlier mentioned impedance L1. Compared to the bipolar rectifier solution this gives no additional load capacitance and only one additional diode voltage drop. However this solution needs more DC bias point stabilisation time than the previous by changing polarity of the input.

Different variations are of course possible within the scope of the invention. The resistor R2 can for example be omitted if lower impedance depending on higher $C_{rss}$ and a smaller signal before clipping can be accepted. R2 may be connected across C1 instead of between MOSFET gate-source. That will only slightly affect the DC bias voltage depending on the size of RL, which normally is made low to get low different DC voltages across the L1 inductor at different drain currents. The more the DC voltage to source-O2 changes, C1 needs more reloading time, which is not desirable. The invention is not limited to the above described and in the drawings shown embodiments but can be modified within the scope of the enclosed claims.

The invention claimed is:

1. An Active load arrangement (Z) for providing output DC load to an object (TO) under AC test, the arrangement (Z) including a voltage controlled transistor (MOSFET) having a source (S), a gate (G) and a drain (D), wherein the drain (D) is associated with the gate (G) and connected to an arrangement input (I2) associated with the object (TO), and the source (S) is connected to an arrangement output (O2) associated with the object, the active load arrangement further comprising:
a feedback arrangement connected to the source (S) and to the gate (G), for obtaining low impedance at low frequencies and high impedance at high frequencies by varying phase and amplitude of the gate-to-source voltage in accordance with variations in frequency, said feedback arrangement comprising:
a first feedback net (FBN1) in which an inductance (L1) is connected between the source (S) and the arrangement output (O2); and
a second feedback net (FBN2) in which a first resistance (R1) is connected between the gate (G) and the arrangement input (I2), and a second resistance (R2) is connected between the gate (G) and the source (S), and a capacitor (C1) is connected between the gate (G) and the arrangement output (O2).

2. An active load arrangement (Z) for providing proper DC output load to an object (TO) under AC test, the arrangement (Z) comprising a voltage controlled transistor (MOSFET) having a source (S), a gate (G) and a drain (D), the drain being connected to an arrangement input (I2) associated with an output (O1) of the object (TO), whereby a first resistance (R1) is connected between the gate (G) and the drain (D), the active load arrangement further comprising:
an inductance (L1) being connected between the source (S) and an arrangement output (O2) associated with an input (I1) of the object (TO), and a capacitance (C1) being connected between the gate (G) and the arrangement output (O2).

3. The active load arrangement (Z) according to claim 2, whereby a second resistance (R2) is connected between the gate (G) and the source (S).

4. The active load arrangement (Z) according to claim 2, whereby a second resistance (R2) is connected in parallel with the capacitance (C1).

5. The active load arrangement (Z) according to claim 2, whereby a rectifier bridge is connected between the test object (TO) and the test arrangement (TA).

6. An active load arrangement (Z1) for providing output load to an object (TO) under test, comprising:
a first voltage controlled transistor (MOSFET) having a source (S), a gate (G) and a drain (D), wherein the drain (D) is associated with the gate (G) and connected to an arrangement input (I2) associated with the object (TO), and the source (S) is connected to an arrangement output (O2) associated with the object, the active load arrangement further comprising a feedback arrangement connected to the source (S) and to the gate (G), for obtaining low impedance at low frequencies and high impedance at high frequencies by varying phase and amplitude of the gate-to-source voltage in accordance with variations in frequency; and
a second voltage controlled transistor (MOSFET2) having a second source (S2), a second gate (G2) and a second drain (D2), the second source (S2) being connected via the feedback arrangement to the source (S) and the gate (G) via a third resistor (R4) and a first capacitor (C1) to the second gate (G2), the second gate (G2) being connected via a fourth resistance (R5) to the drain (D2) and to an arrangement output (O3) associated with the test object (TO) and the second gate (G2) being connected to the source (S) via a second capacitor (C2).

7. The active load arrangement (Z1) according to claim 6, wherein the feedback arrangement comprises a first feedback net (FBN1) in which an inductance (L1) is connected between the source (S) and the arrangement output (O2).

8. The active load arrangement (Z1) according to claim 7, wherein the feedback arrangement further comprises a second feedback net (FBN2) in which a first resistance (R1) is connected between the gate (G) and the arrangement input (I2), and a second resistance (R2) is connected between the gate (G) and the source (S), and a capacitor (C1) is connected between the gate (G) and the arrangement output (O2).

* * * * *

UNITED STATES PATENT AND TRADEMARK OFFICE
CERTIFICATE OF CORRECTION

PATENT NO. : 7,443,232 B2 Page 1 of 1
APPLICATION NO. : 10/517464
DATED : October 28, 2008
INVENTOR(S) : Bladh It is certified that error appears in the above-identified patent and that said Letters Patent is hereby corrected as shown below:

On the Title Page, in Figure, delete "Vgs" and insert -- $V_{gs}$ --, therefor.

In Fig. 1, Sheet 1 of 4, delete "Vgs" and insert -- $V_{gs}$ --, therefor.

In Fig. 2, Sheet 2 of 4, at Junction "D", delete "Idrain" and insert -- $I_{drain}$ --, therefor.

In Fig. 2, Sheet 2 of 4, at Junction "S", delete "Idrain" and insert -- $I_{drain}$ --, therefor.

In Fig. 2, Sheet 2 of 4, delete "Crss" and insert -- $C_{rss}$ --, therefor.

In Fig. 2, Sheet 2 of 4, delete "Vbias" and insert -- $V_{bias}$ --, therefor.

In Fig. 2, Sheet 2 of 4, delete "Rds" and insert -- $R_{ds}$ --, therefor.

In Column 3, Line 21, delete "Crss." and insert -- $C_{rss}$. --, therefor.

Signed and Sealed this

Twentieth Day of October, 2009

David J. Kappos
*Director of the United States Patent and Trademark Office*